(12) United States Patent
Carey (10) Patent No.: US 11,953,936 B2
(45) Date of Patent: Apr. 9, 2024

(54) SYSTEM, APPARATUS AND METHOD FOR IDENTIFYING FUNCTIONALITY OF INTEGRATED CIRCUIT VIA CLOCK SIGNAL SUPERPOSITIONING

(71) Applicant: Silicon Laboratories Inc., Austin, TX (US)

(72) Inventor: Eugenio Carey, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/513,004

(22) Filed: Oct. 28, 2021

(65) Prior Publication Data

US 2023/0134058 A1 May 4, 2023

(51) Int. Cl.
| | |
|---|---|
| *H03K 5/135* | (2006.01) |
| *G01R 31/28* | (2006.01) |
| *G06F 1/10* | (2006.01) |
| *G06F 9/445* | (2018.01) |

(52) U.S. Cl.
CPC .......... *G06F 1/10* (2013.01); *G01R 31/2896* (2013.01); *G06F 9/445* (2013.01); *H03K 5/135* (2013.01)

(58) Field of Classification Search
CPC ....... G06F 1/10; G06F 9/445; G01R 31/2896; G01R 31/28; H03K 5/135
See application file for complete search history.

(56) References Cited

U.S. PATENT DOCUMENTS

| | | | |
|---|---|---|---|
| 4,807,147 A | 2/1989 | Halbert et al. | |
| 5,659,508 A | 8/1997 | Lamphier et al. | |
| 6,278,316 B1 | 8/2001 | Tanzawa et al. | |
| 6,429,725 B1 | 8/2002 | Tanzawa et al. | |
| 8,423,814 B2 | 4/2013 | Loinaz | |
| 8,453,004 B2 | 5/2013 | Kobayashi | |
| 9,983,889 B1* | 5/2018 | Sarmah | .......... G06F 9/445 |
| 2003/0179027 A1* | 9/2003 | Kizer | .......... H03L 7/0805 |
| | | | 327/158 |
| 2004/0086061 A1* | 5/2004 | Lundberg | .......... H04L 7/0008 |
| | | | 375/316 |
| 2014/0043006 A1* | 2/2014 | Tan | .......... H03K 5/135 |
| | | | 323/298 |
| 2014/0225436 A1* | 8/2014 | Lester | .......... H04B 3/54 |
| | | | 307/17 |
| 2018/0234099 A1* | 8/2018 | Zhao | .......... H03L 7/1974 |

(Continued)

FOREIGN PATENT DOCUMENTS

RU        2516703 C1 *  5/2014

OTHER PUBLICATIONS

Silicon Labs; "EFM32G Reference Manual Gecko Series," Feb. 23, 2017, pp. 1-478.

(Continued)

*Primary Examiner* — Tarun Sinha
*Assistant Examiner* — James I Burris
(74) *Attorney, Agent, or Firm* — Trop, Pruner & Hu, P.C.

(57) ABSTRACT

In one embodiment, an apparatus includes: an oscillator to output a clock signal on a first line; a switch coupled to the first line; and a voltage divider coupled to the switch. The switch may be controlled to output the clock signal through the voltage divider via the first line to a pin in a non-reset mode and prevent the clock signal from being provided to the pin in a reset mode.

20 Claims, 8 Drawing Sheets

(56) References Cited

U.S. PATENT DOCUMENTS

2019/0220055 A1\* 7/2019 Gal .................. H03L 7/104
2023/0133848 A1 5/2023 Carey

OTHER PUBLICATIONS

Ruifeng Sun, et al., U.S. Appl. No. 17/363,049, filed Jun. 30, 2021, entitled "Dual-Mode Power Amplifier for Wireless Communication," 29 pages.
Unites States Patent Office, Non-Final Office Action dated Oct. 12, 2023 in U.S. Appl. No. 17/513,017 (27 pages).
Unites States Patent Office, Reply to Office Action dated Jan. 5, 2024 in U.S. Appl. No. 17/513,017 (8 pages).
Unites States Patent Office, Notice of Allowance dated Feb. 5, 2024 in U.S. Appl. No. 17/513,017 (18 pages).

\* cited by examiner

SYSTEM, APPARATUS AND METHOD FOR IDENTIFYING FUNCTIONALITY OF INTEGRATED CIRCUIT VIA CLOCK SIGNAL SUPERPOSITIONING

BACKGROUND

Integrated circuits (ICs) are being adopted into an ever increasing number of devices, including many different types of consumer devices. Such devices include internet of things (IoT) devices that provide for monitoring, sensing and other types of functionality incorporated with wireless capability to enable communication in networks.

Such devices include one or more ICs, and it can be difficult to confirm, e.g., in a troubleshooting situation, whether a given IC is functional, or alive, or has executed at least a portion of a proper boot sequence, or whether a device even has a bootloader installed, and if so, what variety. One such example is when an IC is packaged in a 'bricked' device, and it is not possible to unbrick or unlock the IC, or where it is not possible to connect to a debugger or re-program or even witness any signs of life.

SUMMARY OF THE INVENTION

In one aspect, an apparatus includes: an oscillator to output a clock signal on a first line; a switch coupled to the first line; and a voltage divider coupled to the switch. The switch may be controlled to output the clock signal through the voltage divider via the first line to a pin in a non-reset mode and prevent the clock signal from being provided to the pin in a reset mode.

In an example, the voltage divider comprises: a first resistor coupled between the switch and the pin; and a second resistor coupled between the pin and a supply voltage pin. The apparatus may be an integrated circuit having a single semiconductor die, the first resistor and the second resistor formed on the single semiconductor die. Via the voltage divider, the clock signal is to be output via the pin at an attenuated small signal level. The output of the clock signal at the attenuated small signal level comprises an activity signal to indicate functionality of the apparatus. A modulation of the clock signal at the attenuated small signal level may indicate a type of bootloader.

In an example, the clock signal at the attenuated small signal level is between a supply voltage level and a second voltage level, the second voltage level greater than a logic high threshold level. Via the voltage divider, the clock signal is to be output via the pin at the attenuated small signal level superposed with a reset signal, the reset signal substantially at a supply voltage level in the non-reset mode and the pin is a reset pin.

In an example, the apparatus further comprises a control circuit coupled to the switch, the control circuit to control the switch to couple the clock signal to the pin in response to completion of a reset mode. The control circuit may control the switch to be opened in the reset mode and after the reset mode, the control circuit is to control the switch to be closed.

In an example, the apparatus may further include a monitoring circuit coupled to the pin, the monitoring circuit to identify presence of the clock signal at the attenuated small signal level. The monitoring circuit may comprise an oscilloscope to display the clock signal at the attenuated small signal level. The monitoring circuit may also comprise: a comparator having: a first input terminal coupled to the pin; and a second input terminal to receive a reference voltage, wherein the comparator is to output a comparison signal based on a comparison of a voltage at the pin with the reference voltage; and a light emitting diode coupled to the comparator, where the light emitting diode is to illuminate when the clock signal at the attenuated small signal level is present.

In another aspect, a method comprises: opening a switch of an integrated circuit coupled between an oscillator and a reset pin of the integrated circuit, the oscillator to provide a clock signal; performing a pre-boot sequence of the integrated circuit, in response to release of a logic low voltage at the reset pin; and closing the switch to cause an attenuated version of the clock signal to be superimposed on a reset signal output at the reset pin, to indicate functionality of the integrated circuit.

In an example, the method further comprises identifying at least one parameter of the integrated circuit in response to the attenuated version of the clock signal. The method may further comprise modulating the clock signal with a first modulation to identify at least one parameter of the integrated circuit. The method further may comprise identifying a bootloader type for the integrated circuit according to the first modulation.

In yet another aspect, an integrated circuit comprises: a switch; a core circuit to control the switch; an oscillator to output a clock signal; a first resistor coupled between the switch and a pad of the integrated circuit; and a second resistor coupled between the pad and a supply voltage pad of the integrated circuit, where when the core circuit enables the switch, the clock signal is to be superimposed on a reset signal at the pad. In an example, a voltage of the reset signal with the superimposed clock signal remains above a logic high threshold. The superimposed clock signal may be used to identify functionality of the integrated circuit.

DETAILED DESCRIPTION

In various embodiments, an integrated circuit is provided with circuitry to enable confirmation of available functionality (signs of life) and/or bootloader presence and type, among other status. Such circuitry may leverage existing functional blocks and include additional circuitry to provide this indication. In addition, existing pin space may be used, such that no additional general purpose input output (GPIO) or other pin needs to be dedicated for this functionality determination. At the same time, there is no adverse effect on existing device functionality. Still further the mechanisms described herein may be disabled (e.g., by an application) so as to not incur any power consumption penalty in certain power states.

Embodiments may be used in various situations. In one use case, this circuitry can indicate device functionality at a product test stage, when the IC is powered up. As used here, the term "functionality" with regard to such functionality indication means that the IC, when powered is alive and/or in operation, not necessarily that it performs one or more particular functions or other operations. In another use case, after stuffing production boards with an IC, the IC's viability may be quickly checked without having to connect a debugger and prior to programming the device. A third example is when a device having this IC seems partially unresponsive and it is desirable to know whether or not a bootloader has been satisfactorily programmed and executed. Note that this bootloader may be stored in a non-volatile memory (e.g., a flash memory) of the IC.

Figure 1:
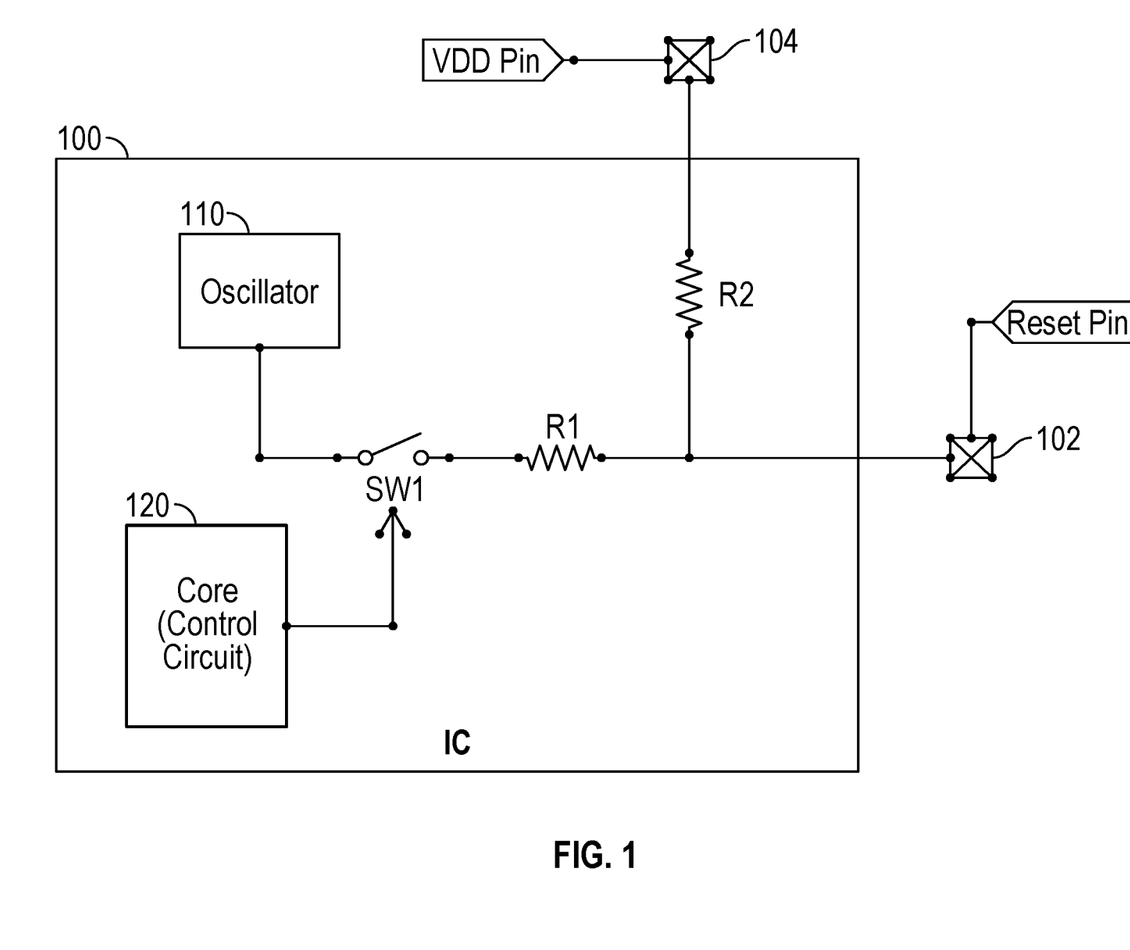
FIG. 1 is a block diagram of an apparatus in accordance with an embodiment.

Referring now to FIG. 1, shown is a block diagram of an apparatus in accordance with an embodiment. As shown in FIG. 1, an integrated circuit (IC) 100 is present and is coupled to a reset pin 102 and a supply voltage pin 104. Note that as used herein, the terms "pin" and "pad" are used interchangeably and refer to any conductive element that enables interconnection of an IC with other circuitry. To this end, note that while pins 102, 104 are shown external to a die of IC 100, they may be part of a package or other socket of the IC. In any case, understand that there may be corresponding pads within the die of IC 100 (not shown) that in turn couple to pins 102, 104, e.g., via wire bonds.

As illustrated, IC 100 includes an oscillator 110 that may operate to generate a clock signal continuously when power is available. Although embodiments are not limited in this regard, oscillator 110 may be implemented as a low power RC oscillator to generate this clock signal at an ultralow frequency, e.g., at 1 kilohertz (kHz). Of course other examples are possible. Understand that this clock signal may be used by various circuitry within IC 100.

In addition as further shown in FIG. 1, when a switch SW1 is closed, this clock signal (or more specifically an attenuated version of this clock signal) may pass along a signal line out to reset pin 102. As will be described herein, when this attenuated clock signal is provided, it functions as an alive or activity indicator to indicate to an external entity that IC 100 is functional or has executed at least a portion of a proper boot sequence. In still further situations, this activity signal may also indicate status information regarding IC 100, such as whether a bootloader is installed and if so, what variety. Of course, this clock signal in other cases may provide other indications to an external entity, such as whether IC 100 is debug-locked.

Still with reference to FIG. 1, note that switch SW1 may be controlled under control of a core 120. In embodiments, core 120 may be a main processor of IC 100 such as a microcontroller. Based upon mode of operation, core 120 may control switch SW1 to be either in an opened position or a closed position as will be described further herein. Although embodiments described herein may use a general-purpose processing core that may execute instructions stored in a non-transitory storage medium to cause generation of an activity signal, other control circuitry may be used. That is, in other cases a shared or dedicated control circuit, state machine or other programmable circuit may be configured to control switch SW1 (e.g., under program control) to effect generation of an activity signal as described herein.

The ability to provide the clock signal to reset pin 102 at an attenuated level may be realized via a voltage divider formed of a first resistor R1 and a second resistor R2. As shown, resistor R1 is located on a signal path between switch SW1 and reset pin 102. In turn, resistor R2, which may be an internal pullup resistor of IC 110, is coupled between supply voltage pin 104 and reset pin 102. Although embodiments are not limited in this regard, the values of these resistors may be set in one example at approximately 400 kiloohms (kΩ) for resistor R1 and at approximately 40 kΩ for resistor R2. Understand while shown at this high level in the embodiment of FIG. 1, many variations and alternatives are possible. For example, in other cases, at least one of the resistors (e.g., the pullup resistor) may be an external resistor present on a circuit board on which IC 100 is adapted.

Note that the activity signal does not affect normal device reset operation. During normal boot, switch SW1 is open and the activity signal is not present. During this boot or reset mode, somehow the voltage at reset pin 102 (which is used as a reset signal) is pulled to a logic low level, which triggers a reset flow of IC 100, e.g., via a manual pushbutton or a logic low level digital signal from an external IC.

Sometime after the release of reset pin 102 (such that the reset signal goes to a supply voltage level) and prior to (possibly installed) bootloader code execution (the exact onset in terms of timing may vary depending on implementation), core 120 closes switch SW1 to connect the always operational oscillator 110 to resistor R1. By way of the voltage divider formed by resistors R1 and R2, this oscillator clock signal becomes an attenuated small-signal clock signal that is superimposed on the upper end of the reset pin voltage, i.e., a reset signal. This small-signal clock signal can be used, for example, as the activity signal. Note that with embodiments, the signal swing of the activity signal is small enough so that it does not violate the logic level high minimum (0.8*VDD) to the downside, but is large enough (e.g., 150-300 millivolts (mV)) to be easily resolved by external hardware. Stated another way, this activity signal and the reset signal may both share the reset pin concurrently, both providing their information without conflict.

Figure 2:
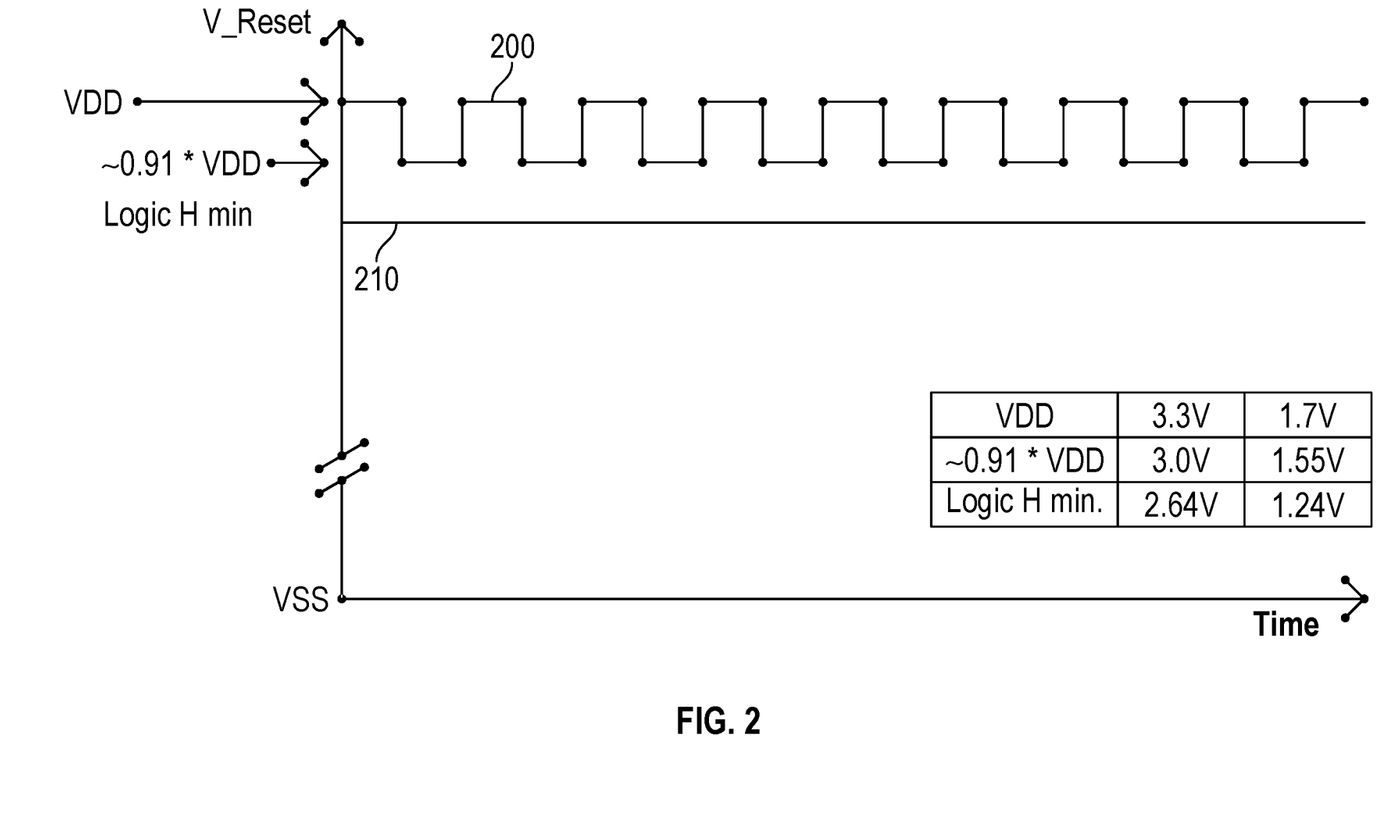
FIG. 2 is a graphical illustration of an activity signal in accordance with an embodiment.

Referring now to FIG. 2, shown is a graphical illustration of an activity signal in accordance with an embodiment. As shown in FIG. 2, activity signal 200 may be provided to a reset pin at an attenuated small signal level, e.g., having a signal swing of approximately 0.1 VDD. This small signal may be realized by way of a voltage divider such as discussed above with regard to FIG. 1. Note that as described herein, clock signal 200, via the voltage divider, can be used as the activity signal. This activity signal, when output via a reset or other pin, provides an indication to an external entity that the IC is alive and functional, as well as potentially providing other information about the IC and its environment.

Note that in FIG. 2, activity signal 200 is a square wave clock signal having a frequency, e.g., 1 kHz, as output by an on-chip oscillator; of course, other shapes and frequencies are possible. Note also that activity signal 200 is superpositioned with respect to a supply voltage level, i.e., the reset signal typically present on the reset pin during normal operation. That is, given the attenuated signal swing shown in FIG. 2, even at a minimum of the signal swing, activity signal 200 is still above a threshold voltage level for a logic high signal (shown at level 210 in FIG. 2). As such, an ordinary consumer of the reset signal in normal operation may still receive it in its high state.

As shown in FIG. 2, the activity signal (as present at a reset pin) has a frequency corresponding to the output clock signal of oscillator 110 (e.g., 1 kHz)), and its amplitude is from VDD down to ~0.91*VDD. The high logic level minimum 210 at 0.8 VDD is well clear of the lowest activity signal swing (by ~300-350 mV). FIG. 2 also shows a table showing typical pertinent voltage levels in accordance with an embodiment.

As discussed above, an activity signal generated as described herein may provide an indication to an external entity regarding the IC. This external entity may be a designer of the IC or a device that incorporates the IC. Alternatively, the external entity may be a troubleshooter such as a debug engineer, field engineer or other, seeking to perform troubleshooting of a device to determine whether the IC is correctly operating. Of course this activity signal may act as an indicator to other entities, even potentially an end user of a device incorporating an IC in accordance with an embodiment.

Figure 3:
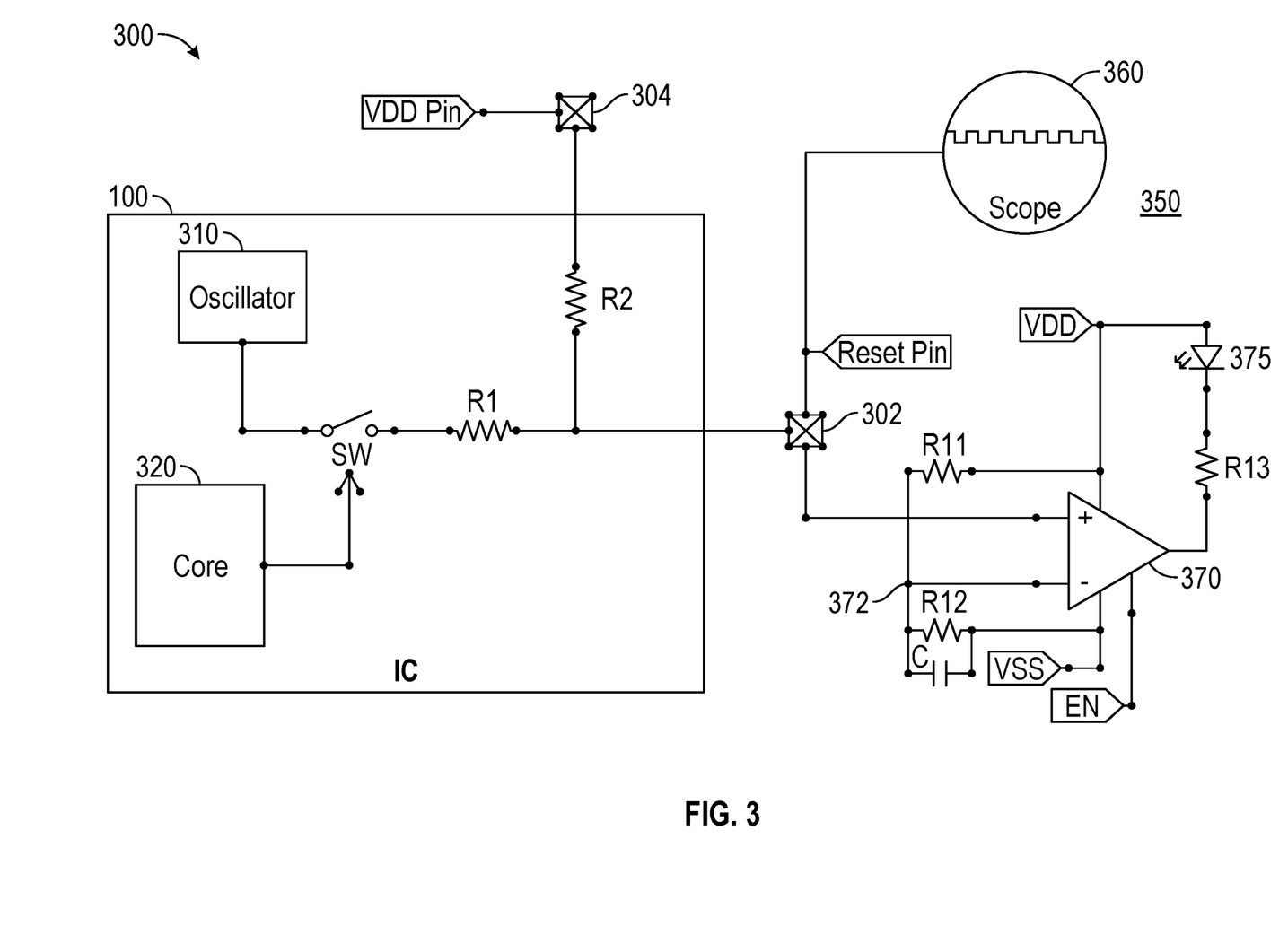
FIG. 3 is a block diagram of a device in accordance with an embodiment.

Referring now to FIG. 3, shown is a block diagram of a device in accordance with an embodiment. As shown in FIG. 3, a device 300 may be any type of device having an IC in accordance with an embodiment. As one example, device 300 may be implemented as a prototype or evaluation circuit board including an IC and additional circuitry. In other cases, device 300 may be an end user device such as an IoT device that includes circuitry to monitor for presence of the activity signal. Such implementation may be appropriate where the size and cost for the components to monitor the activity signal are warranted for a given design.

In any event, device 300 is shown in a test environment, which may be realized in a test bench or other lab arrangement of a device designer. In other cases, the environment may be realized by an external oscilloscope that couples to a reset pin, in addition or separately from other circuitry of the test environment.

As shown in FIG. 3, device 300 includes an IC 100 which may be the same as shown in FIG. 1 (and thus the same numbering scheme is used as FIG. 1, albeit of the "300 series" (and lettered components remain the same)). Device 300 includes, in addition to IC 100, monitoring circuitry (generally illustrated at 350). In this embodiment, monitoring circuitry 350 includes an oscilloscope 360, which may be an external device that couples to reset pin 302. Presence of an oscilloscope is optional and may occur in lab environments where a designer, applications engineer, troubleshooter or other can couple an oscilloscope probe to reset pin 302.

As further shown, monitor circuit 350 further includes a comparator 370. Comparator 370 has a first input terminal coupled to reset pin 302 and a second input terminal coupled to a reference node 372. In an embodiment, comparator 370 may be implemented as an external SOT-23 (or similar) packaged, low-power analog comparator. In the embodiment shown, comparator 370 may have an enable (to turn it off when not in use for power savings). Reference node 372 may provide a threshold voltage that comparator 370 uses to compare against the voltage at reset pin 302. As one example, the reference voltage may be set at a level halfway between the supply voltage level (VDD) and the low swing of the activity signal (~0.95*VDD (about half way between the activity signal high and low amplitudes)). As illustrated, reference node 372 couples to a reference circuit having serial-coupled resistors R11, R12, respectively coupled to a supply voltage node and a reference voltage node. As further shown, this reference circuit may include a capacitor C coupled in parallel with resistor R12.

As further illustrated, the output of comparator 370, a comparison signal, in turn couples via a resistor R13 to a light emitting diode (LED) 375. With this arrangement, LED 375 may illuminate when an activity signal is present. Of course instead of a visual manifestation, another way to identify presence of the activity signal may be provided, such as an audio indication or vibration. Or the output of comparator 370 may be provided to another microcontroller or IC of a system.

Depending on situation, one or more capabilities for monitoring for presence of an activity signal may exist. These capabilities may be provided either simultaneously or singly to visually or audially manifest the activity signal to the designer/troubleshooter.

By way of a connected oscilloscope to reset pin 302, superposition of the activity signal on the reset signal can be seen, as in the illustration of a display of oscilloscope 360. With this configuration the comparator output oscillates in synch with the clock signal and drives what appears to be a continuously illuminated LED, thus providing an indication of device activity. If comparator 370 is connected and an oscilloscope signal is also desirable, a user may probe the comparator output instead of the reset pin directly.

In one implementation, the connection of a probe having a 1 Megaohm (MΩ) resistance in parallel with a 13 pico-Farad (pF) capacitance at the reset pin will effectively put that 1 MΩ in parallel with internal resistor R1 (makes for ~286 kΩ) when the clock signal output is at VSS. This arrangement increases the swing or amplitude of the activity signal, extending its lower excursion from ~0.91*VDD to ~0.877*VDD.

Figure 4:
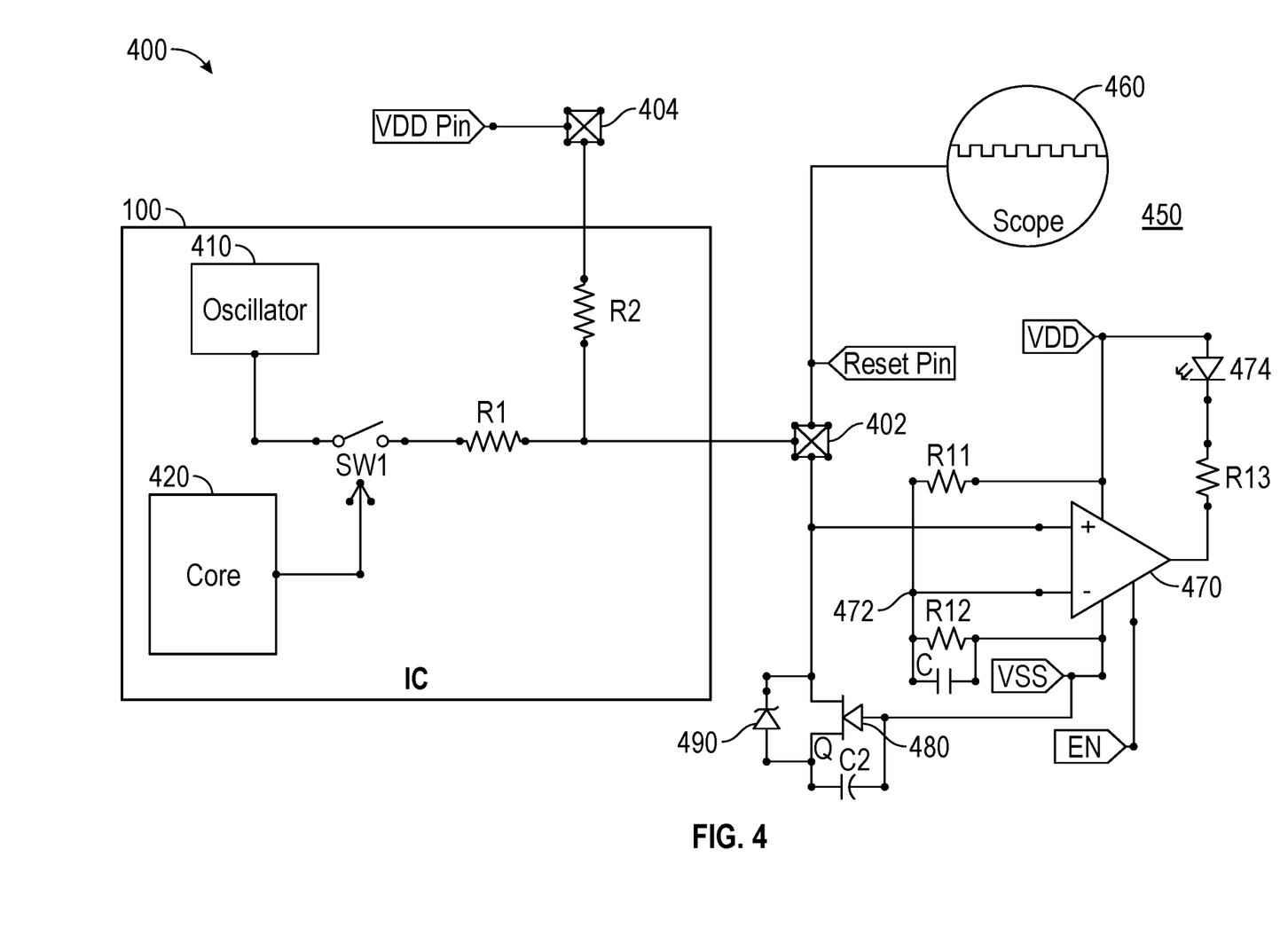
FIG. 4 is a block diagram of a device in accordance with another embodiment.

Referring now to FIG. 4, shown is a block diagram of a device in accordance with another embodiment. As shown in FIG. 4, a device 400 may generally be configured as in FIG. 3 with an IC 100 and monitoring circuitry 450 (and thus the same numbering scheme is used in FIG. 1 (and FIG. 3), albeit of the "400 series"), such that like elements are not further discussed.

As illustrated, a transistor 480 is present and is coupled between reset pin 402 and VSS. In the embodiment shown, transistor 480 may be implemented as an N-channel junction field effect transistor (JFET) having a drain terminal coupled to reset pin 402, a source terminal coupled in parallel with the drain terminal via a Schottky diode 490, and a gate terminal coupled to VSS. In addition, another capacitor C2, which acts as timing capacitor, couples between the gate and source terminals.

This implementation may be desirable as many designers extend the reset pulse using an external capacitor coupled between the reset pin and a reference voltage level (e.g., VSS), to provide an RC time constant formed by that capacitor and the internal pullup resistor. In this way, it may be ensured that a primary power supply has had enough time to ramp up from near zero volts and properly settle into its tolerance range before the device is allowed to exit the reset condition. Placing a capacitor directly on the reset pin may swamp out the activity signal, since its associated impedance at the oscillator frequency of 1 kHz is much smaller than other impedances on the reset node. With the typical magnitudes of capacitance used on today's designs, the activity signal may be too small to practically resolve by external circuitry without resorting to expensive devices and the signal could very well be in the noise.

Thus as in FIG. 4, a small JFET 480 may be introduced in series with timing capacitor C2 (symbol shown as polarized capacitor, indicating that arbitrarily large values of even electrolytic capacitance may be used without any problem). When reset pin 402 is released from actuation (and the activity-indication functionality is not yet activated), JFET 480 provides a low impedance path for internal pullup resistor R2 to charge external timing capacitor C2. As the capacitor charges, Vgs of JFET 480 is increasingly more negative in magnitude until pinchoff occurs in its channel (i.e., the FET drain-to-source channel becomes very high impedance) and capacitor C2 is effectively disconnected from reset pin 402, except that the Schottky reverse leakage current applies a top-off charge to ensure that JFET 480 is not always at the very edge of pinchoff, but deeper into it. On application of the next logic low voltage at the reset pin, timing capacitor C2 discharges through Schottky diode 490, and JFET 480 will once again be low impedance from drain to source, enabling re-charging of timing capacitor C2 for the desired RC reset delay.

In embodiments, an application or other entity may be configured to optionally disable the activity-indication functionality so as to save the energy that is otherwise expended by current flowing through the internal pullup resistor to VSS whenever the oscillator output is at a logic low level.

Figure 5:
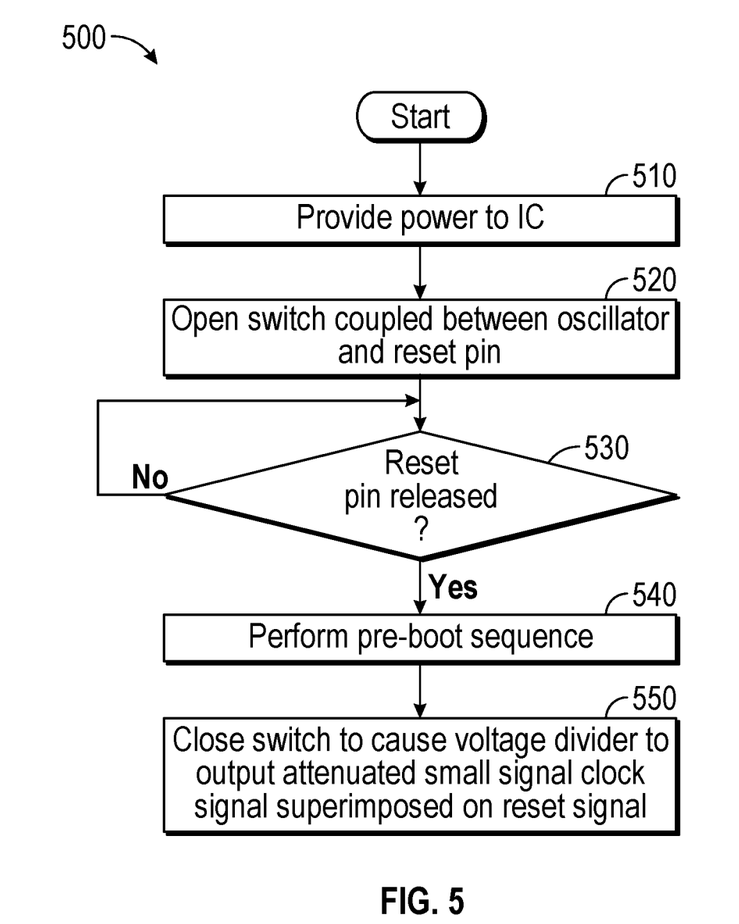
FIG. 5 is a flow diagram of a method in accordance with an embodiment.

Referring now to FIG. 5, shown is a flow diagram of a method in accordance with an embodiment. As shown in FIG. 5, method 500 is a method for operating an IC having an activity indication circuit as described herein. Such operation may occur in different environments, such as a lab environment, debug environment, manufacturing environment or even in the field. In any event, method 500 begins by providing power to the IC (block 510). For example, a device including the IC may be turned on and power is provided to the IC by way of at least one supply voltage pin that couples to at least one pad of the IC. Next at block 520, a switch coupled between an oscillator such as an always-on low power oscillator as described herein and a reset pin can be opened. Note that this opening of the switch may be a default configuration of the switch.

Still with reference to FIG. 5, next it may be determined whether a reset pin is released (diamond 530). This reset pin release may be controlled by a reset controller of the device, which releases a logic low of a reset signal when a voltage regulator or other power source has reached a sufficiently high supply voltage level in order to power on the circuitry of the IC, and the IC has completed a reset mode. The reset pin may also be released via release of a manual pushbutton with electrical contacts that otherwise hold the reset pin at logic low.

At this point, a typical pre-boot sequence may be performed (block 540). Although embodiments are not limited in this regard, such pre-boot operation may include turning on the low power oscillator, running a state machine that reads calibration values from a non-volatile memory and populates various registers. Note that this pre-boot sequence may be performed before any code execution and even prior to execution of an installed bootloader.

Once the pre-boot sequence is completed, at block 550 the switch may be closed to cause a voltage divider (such as described above in FIG. 1) to output an attenuated small signal clock signal that is superimposed on the reset signal. Stated another way, by closing the switch, the presence of the activity signal is made available via the reset pin, which enables a user to identify its presence. At the same time, this activity signal does not interfere with the normal operation of the reset pin to maintain a high level of the reset signal (or at least until the reset pin is pulled low, e.g., by a user depressing a reset button of the device or other mechanism to seek a reset).

Understand while shown at this high level in the embodiment of FIG. 5, many variations and alternatives are possible. Note that after this point, additional operations of a complete boot sequence from power on to code execution may be performed. Such operations may include a check for presence of a bootloader, and if present, execution may jump to its location in non-volatile memory and begin code execution. Otherwise, if a bootloader is not present, control may jump to the start of application code to begin code execution.

Figure 6:
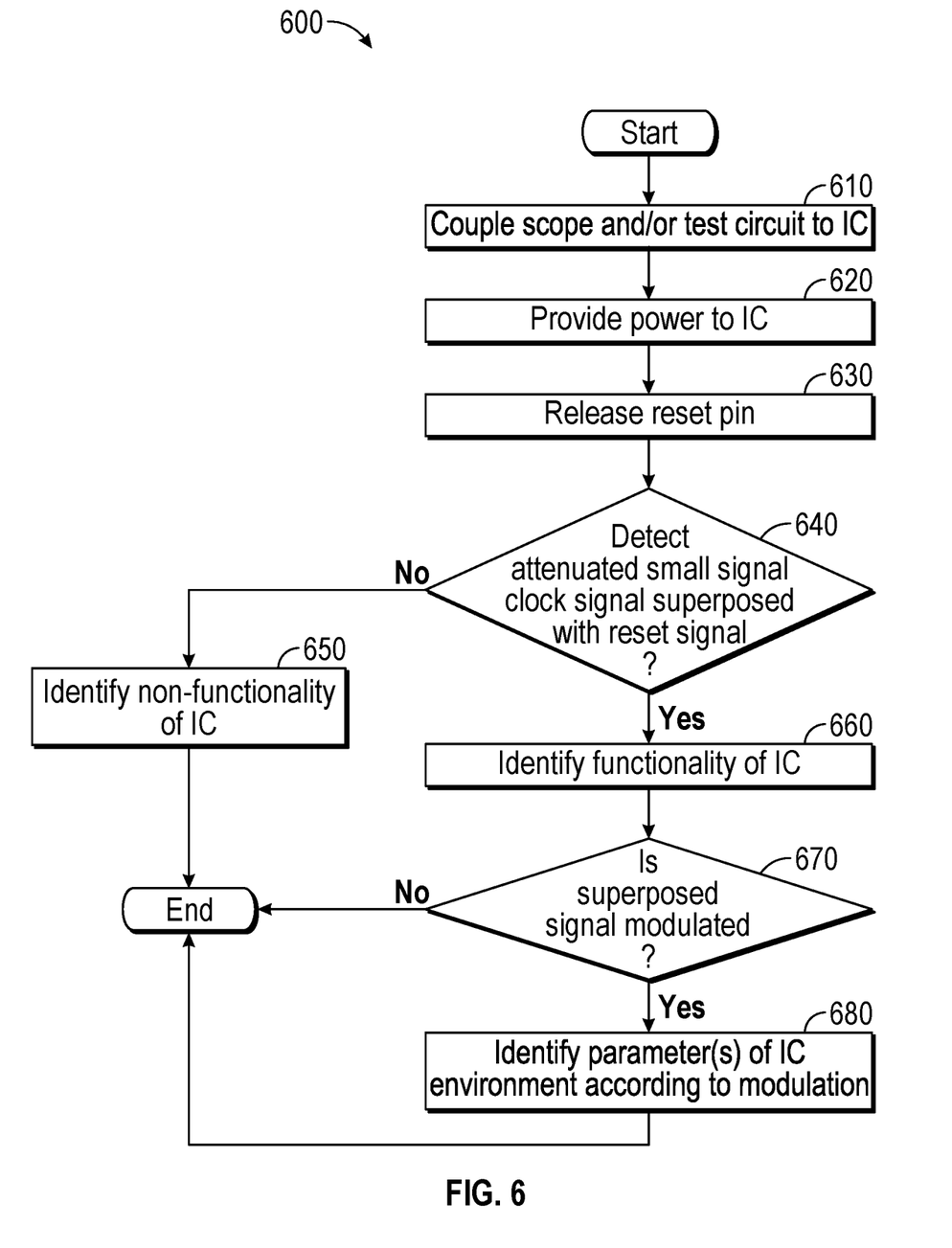
FIG. 6 is a flow diagram of a method in accordance with another embodiment.

Referring now to FIG. 6, shown is a flow diagram of a method in accordance with another embodiment. More specifically, method 600 of FIG. 6 may be performed by a user who seeks to identify or detect presence of an activity signal, to confirm IC functionality and/or various parameters of the IC.

As shown, method 600 begins by coupling a scope such as an oscilloscope and/or a test circuit to the IC (block 610). While being described as coupling to the IC, note that such connection can be made to connection points, e.g., a contact available on a circuit board on which the IC is adapted. Note that the test circuit may include the monitoring circuitry such as described above with regard to FIG. 3 or 4. Of course in some cases, the device itself may include this test circuit, such as an evaluation board that includes this circuitry to enable easy identification of the presence of the activity signal.

Next in a similar manner as described with regard to FIG. 5, power may be provided to the IC at block 620 and the reset pin is released at block 630. Thereafter, it may be determined at diamond 640 whether the attenuated small signal clock signal is superposed with the reset signal. Stated another way, a user may seek to determine whether the activity signal is present, e.g., by way of a coupled oscilloscope or by a test circuit having an output indicator, such as the LED described above. If this signal is not detected when power is appropriately provided and a timeout period for transitioning into normal operation has passed, the IC may be identified as being non-functional (block 650).

Instead if this activity signal is detected, control passes to block 660 where the IC may be identified as being functional. Note that in some cases method 600 may conclude here where the activity signal is being used for the purpose of identifying aliveness or basic functionality of the IC.

As described above, it is also possible to use this activity signal to identify certain parameters of the IC, such as whether a bootloader is installed and if so, a type of bootloader present. Thus as further shown at diamond 670, it may be determined whether this superposed activity signal is modulated. If not, as described above, the basic functionality is confirmed and the method may conclude. If it is determined that the activity signal is modulated, control passes to block 680 where one or more parameters of the IC environment may be identified according to the modulation applied to the signal. For example, different modulations schemes may be used to identify different types of bootloaders present.

As an example, different modulation schemes may be used to identify whether a bootloader is installed, and if so, whether a traditional UART bootloader, a dummy stub, or other bootloaders are present. These bootloader types may be revealed by modulating the activity signal by an amplitude or frequency shift keying technique such as on-off key (OOK) modulation with different symbol durations for viewing on an oscilloscope. Understand while shown at this high level in the embodiment of FIG. 6, many variations and alternatives are possible.

Figure 7:
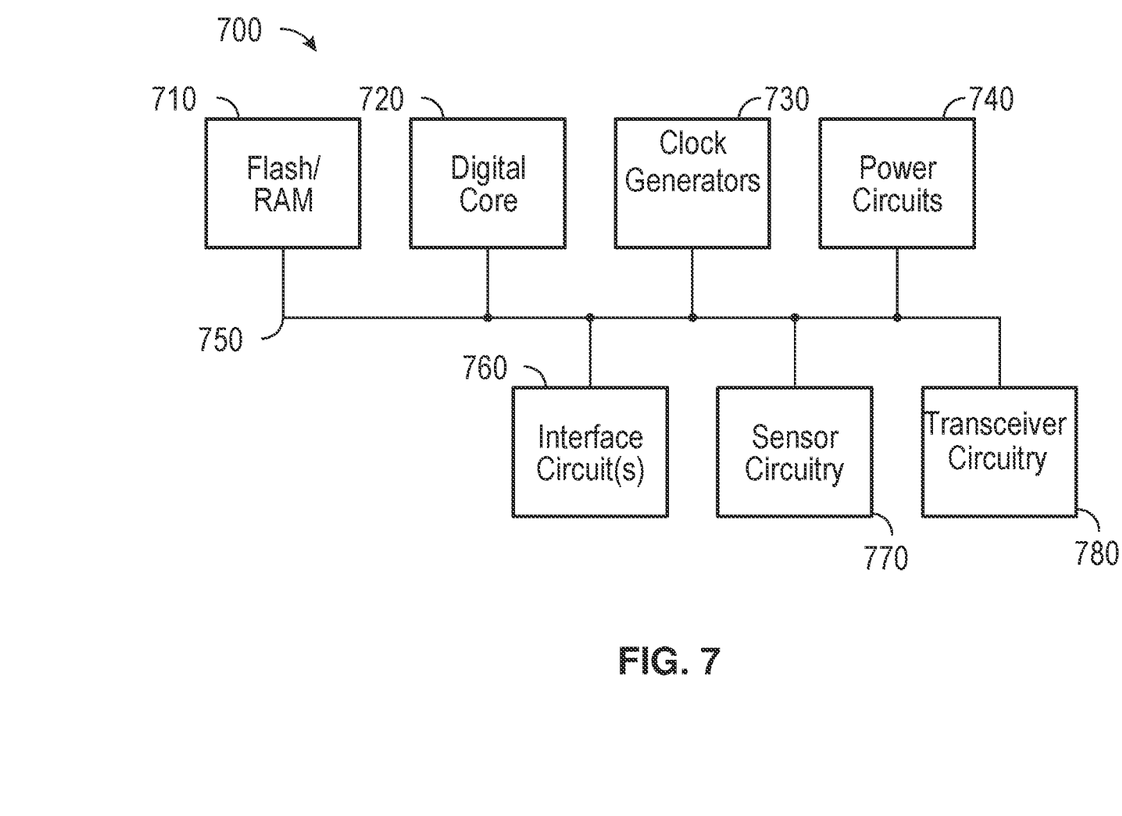
FIG. 7 is a block diagram of a representative integrated circuit in accordance with an embodiment.

Embodiments can be implemented in many different environments. Referring now to FIG. 7, shown is a block diagram of a representative integrated circuit 700 that can be configured for generating an activity signal as described herein. In the embodiment shown in FIG. 7, integrated circuit 700 may be, e.g., a microcontroller, wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth, and which may be particularly adapted for use in an IoT device.

In the embodiment shown, integrated circuit 700 includes a memory system 710 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for closing a switch to cause output of the activity signal (and possible later disabling of the same) in accordance with an embodiment.

Memory system 710 couples via a bus 750 to a digital core 720, which may include one or more cores and/or microcontrollers that act as a main processing unit of the integrated circuit. In turn, digital core 720 may couple to clock generators 730 which may provide one or more phase locked loops or other clock generator circuitry to generate various clocks for use by circuitry of the IC, including the low power clock signal on which the activity signal may be superposed.

As further illustrated, IC 700 further includes power circuitry 740, which may include one or more voltage regulators. Additional circuitry may optionally be present depending on particular implementation to provide various functionality and interaction with external devices. Such circuitry may include interface circuitry 760 which may provide interface with various off-chip devices, sensor circuitry 770 which may include various on-chip sensors including digital and analog sensors to sense desired signals, such as for a metering application or so forth.

In addition as shown in FIG. 7, transceiver circuitry 780 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. Understand while shown with this high level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 8:
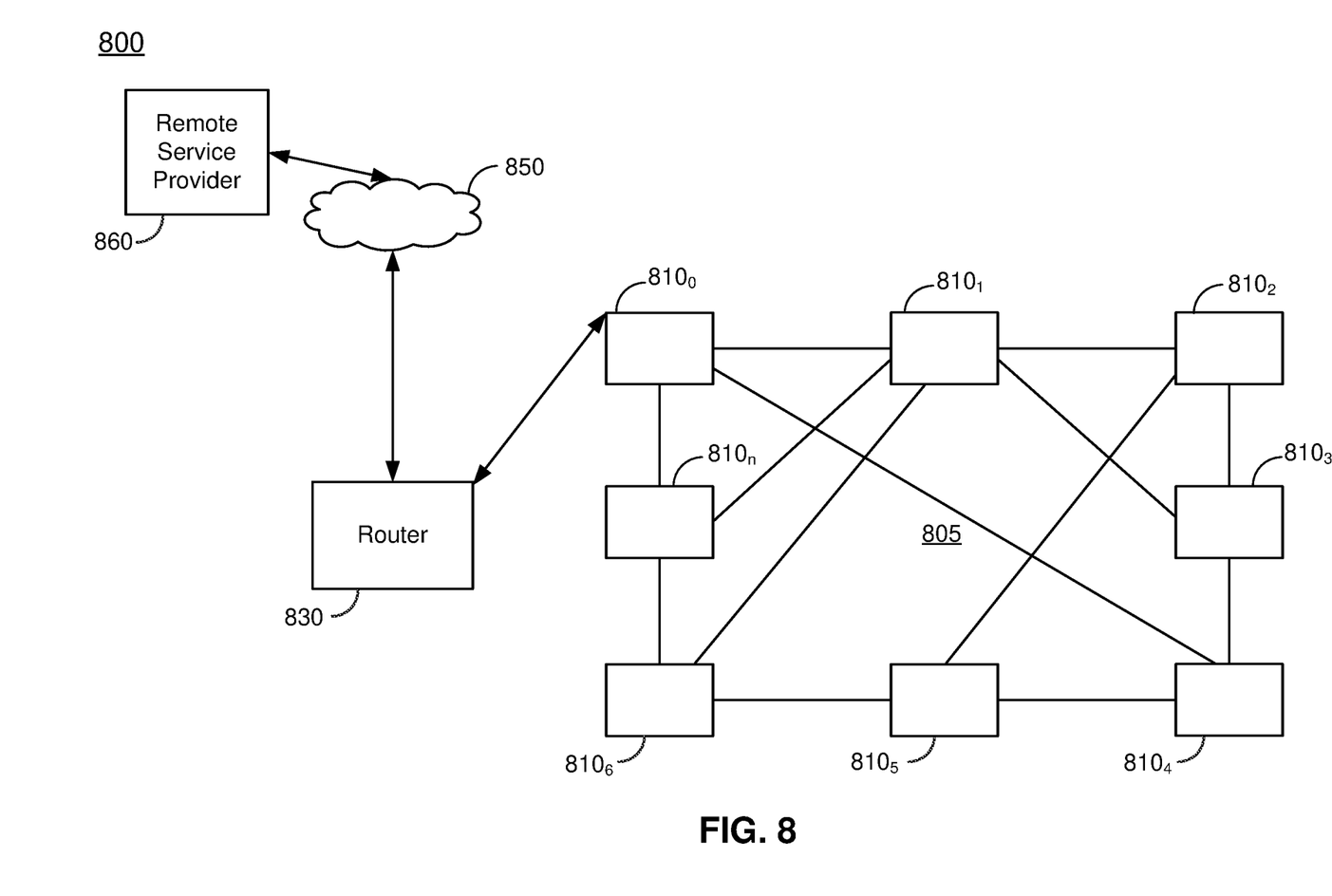
FIG. 8 is a block diagram of a system in accordance with an embodiment.

Referring now to FIG. 8, shown is a high level diagram of a network in accordance with an embodiment. As shown in FIG. 8, a network 800 includes a variety of devices, including smart devices such as IoT devices, routers and remote service providers. In the embodiment of FIG. 8, a mesh network 805 may be present, e.g., in a building having multiple IoT devices $810_{0-n}$. Such IoT devices may enable generation of an activity signal as described herein. As shown, at least one IoT device 810 couples to a router 830 that in turn communicates with a remote service provider 860 via a wide area network 850, e.g., the internet. In an embodiment, remote service provider 860 may be a backend server of a utility that handles communication with IoT devices 810. Understand while shown at this high level in the embodiment of FIG. 8, many variations and alternatives are possible.

With embodiments, the activity signal provided via a reset pin provides a developer such as a designer of the IC itself or a downstream customer incorporating the IC into a device, the immediate ability, upon boot, to discern whether the device is alive or dead. For example, via this mechanism it can be determined if the device may be damaged by overvoltage or permanent damage due to electrostatic discharge, or so forth. As a result, development time may be saved by this early identification of device functionality or aliveness. Still further, by providing different modulation patterns to the activity signal, certain parameters of the IC and/or its environment may be readily ascertained, simply by identifying the activity signal having a particular modulation type.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
an oscillator to output a clock signal on a first line;
a switch coupled to the first line, the switch configured to pass the clock signal when closed;
a voltage divider coupled to the switch, a first pin and a second pin, the first pin and the second pin external to a semiconductor die of the apparatus; and
a control circuit coupled to the switch, the control circuit configured to cause the switch to output the clock signal through the voltage divider via the first line to the first pin in a non-reset mode and prevent the clock signal from being provided to the first pin in a reset mode, the non-reset mode following the reset mode in which a reset flow of the apparatus occurs.

2. The apparatus of claim 1, wherein the voltage divider comprises:
a first resistor coupled between the switch and the first pin; and
a second resistor coupled between the first pin and the second pin comprising a supply voltage pin.

3. The apparatus of claim 2, wherein the apparatus comprises an integrated circuit having a single semiconductor die, the first resistor and the second resistor formed on the single semiconductor die.

4. The apparatus of claim 1, wherein the voltage divider is configured to cause the clock signal to be output via the first pin at an attenuated small signal level.

5. The apparatus of claim 4, wherein the output of the clock signal at the attenuated small signal level comprises an activity signal to indicate functionality of the apparatus.

6. The apparatus of claim 4, wherein the apparatus is configured to modulate the clock signal at the attenuated small signal level to indicate a type of bootloader.

7. The apparatus of claim 4, wherein the apparatus is configured to provide the clock signal at the attenuated small signal level between a supply voltage level and a second voltage level, the second voltage level greater than a logic high threshold level.

8. The apparatus of claim 4, wherein the voltage divider is configured to cause the clock signal to be output via the first pin at the attenuated small signal level superposed with a reset signal, the reset signal substantially at a supply voltage level in the non-reset mode and the first pin comprising a reset pin.

9. The apparatus of claim 1, wherein the control circuit is configured to control the switch to couple the clock signal to the first pin in response to completion of the reset mode.

10. The apparatus of claim 9, wherein the control circuit is configured to control the switch to be opened in the reset mode and after the reset mode, the control circuit is to control the switch to be closed.

11. The apparatus of claim 4, further comprising a monitoring circuit coupled to the first pin, the monitoring circuit configured to identify presence of the clock signal at the attenuated small signal level.

12. The apparatus of claim 11, wherein the monitoring circuit comprises an oscilloscope, the oscilloscope to display the clock signal at the attenuated small signal level.

13. The apparatus of claim 11, wherein the monitoring circuit comprises:
   a comparator having:
      a first input terminal coupled to the first pin; and
      a second input terminal to receive a reference voltage, wherein the comparator is to output a comparison signal based on a comparison of a voltage at the first pin with the reference voltage; and
   a light emitting diode coupled to the comparator, wherein the light emitting diode is configured to illuminate when the clock signal at the attenuated small signal level is present.

14. A method comprising:
   during a reset mode in which a reset flow occurs, opening a switch of an integrated circuit coupled between an oscillator and a reset pin of the integrated circuit, the oscillator to provide a clock signal, wherein the opened switch is a default configuration of the switch, the reset pin external to a die of the integrated circuit;
   after opening the switch, performing a pre-boot sequence of the integrated circuit, in response to release of a logic low voltage at the reset pin; and
   during a non-reset mode following the reset mode, closing the switch to cause an attenuated version of the clock signal to be superimposed on a reset signal output at the reset pin while the reset signal is maintained above a logic high threshold level, to indicate functionality of the integrated circuit.

15. The method of claim 14, further comprising identifying at least one parameter of the integrated circuit in response to the attenuated version of the clock signal.

16. The method of claim 14, further comprising modulating the clock signal with a first modulation to identify at least one parameter of the integrated circuit.

17. The method of claim 16, further comprising identifying a bootloader type for the integrated circuit according to the first modulation.

18. An integrated circuit comprising:
   a switch;
   an oscillator to output a clock signal;
   a first resistor coupled between the switch and a pad of the integrated circuit, the pad to couple to a first pin external to a die of the integrated circuit;
   a second resistor coupled between the pad and a supply voltage pad of the integrated circuit, the supply voltage pad to couple to a second pin external to the die of the integrated circuit; and
   a core circuit configured to control the switch, wherein the core circuit is cause the switch to open during a reset mode in which a reset flow of the integrated circuit occurs and thereafter cause the switch to close in a non-reset mode to cause the clock signal to be superimposed on a reset signal at the pad.

19. The integrated circuit of claim 18, wherein a voltage of the reset signal with the superimposed clock signal remains above a logic high threshold.

20. The integrated circuit of claim 18, wherein the superimposed clock signal is to identify functionality of the integrated circuit.

* * * * *